(12) United States Patent
Schmitt et al.

(10) Patent No.: US 7,853,060 B2
(45) Date of Patent: Dec. 14, 2010

(54) METHOD AND MR SYSTEM FOR GENERATING MR IMAGES

(75) Inventors: Peter Schmitt, Weisendorf (DE); Michael Wendt, West Chester, PA (US); Dieter Kleinschmidt, Poxdorf (DE); Peter Speier, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 914 days.

(21) Appl. No.: 11/734,906

(22) Filed: Apr. 13, 2007

(65) Prior Publication Data

US 2007/0242866 A1    Oct. 18, 2007

(30) Foreign Application Priority Data

Apr. 13, 2006  (DE) .................. 10 2006 017 470

(51) Int. Cl.
*G06K 9/00* (2006.01)
(52) U.S. Cl. .................. 382/128; 324/307; 324/309
(58) Field of Classification Search .................. 382/128; 324/307, 309
See application file for complete search history.

(56) References Cited

U.S. PATENT DOCUMENTS

| | | | |
|---|---|---|---|
| 5,713,358 | A | 2/1998 | Mistretta et al. |
| 6,487,435 | B2 | 11/2002 | Mistretta et al. |
| 6,794,869 | B2 * | 9/2004 | Brittain ............ 324/309 |
| 7,132,828 | B2 | 11/2006 | Lustig |
| 7,408,345 | B2 * | 8/2008 | Bammer et al. ........ 324/307 |
| 2002/0111549 | A1 | 8/2002 | Wang |
| 2002/0156364 | A1 | 10/2002 | Madore |
| 2003/0080737 | A1 | 5/2003 | Loeffler |
| 2006/0062486 | A1 | 3/2006 | Lee et al. |
| 2006/0062731 | A1 | 3/2006 | Bammer et al. |

FOREIGN PATENT DOCUMENTS

WO    WO 2004/008169    1/2004

OTHER PUBLICATIONS

"Reduced Aliasing Artifacts Using Variable-Density κ-Space Sampling Trajectories," Tsai et al., Magnetic Resonance in Medicine, vol. 43, (2000) pp. 452-458.
"SENSE: Sensitivity Encoding for Fast MRI." Pruessmann et al., Magnetic Resonance in Medicine, vol. 42 (1999) pp. 952-962.
"Partially Parallel Imaging With Localized Sensitivities (PILS)," Griswold et al., Magnetic Resonance in Medicine, vol. 44 (2000), pp. 602-609.
"Simultaneous Acquisition of Spatial Harmonics (SMASH): Fast Imaging with Radiofrequency Coil Arrays," Sodickson et al., Magnetic Resonance in Medicine, vol. 38 (1997) pp. 591-603.

(Continued)

*Primary Examiner*—Tom Y Lu
(74) *Attorney, Agent, or Firm*—Schiff Hardin LLP (57) ABSTRACT

In a method and apparatus for generation of magnetic resonance images, a number of three-dimensional volume data sets of a subject are acquired in k-space, with each three-dimensional volume data set being acquired with a non-constant density. Filtered three-dimensional volume data sets are generated in k-space, which are assembled from a number of the three-dimensional volume data sets. Three-dimensional image data sets are reconstructed on the basis of filtered three-dimensional volume data sets.

40 Claims, 9 Drawing Sheets

OTHER PUBLICATIONS

Generalized Autocalibrating Partially Parallel Acquisitions (GRAPPA), Griswold et al., Magnetic Resonance in Medicine, vol. 47 (2002) pp. 1202-1210.

Quantitative Evaluation of Several Partial Fourier Reconstruction Algorithms Used in MRI, McGibney et al., Magnetic Resonance in Medicine, vol. 30 (1993) pp. 51-59.

"Complete κ-space Windows (Keyhole techniques) to Improve Temporal Resolution in a Dynamic Series of Images Following Contrast Administration," Brummer et al., Proceedings SMRM 1992, No. 4236.

Temporal Resolution Improvement in Dynamic Imaging, Fredrickson et al., Proceedings SMRM 1995, No. 197.

"The Discrimination of Different Muscle-Group-Work Rates in the Calf During Plantar Flexion," Zhu et al., Proceedings SMRM 1992, No. 1139.

"ATP Turnover in Human Muscle During Ischemic and Aerobic Exercise," Kemp et al. Proceedings SMRM 1992, No. 1138.

* cited by examiner

METHOD AND MR SYSTEM FOR GENERATING MR IMAGES

BACKGROUND OF THE INVENTION

1. Field of the Invention

The present invention concerns a method for generation of magnetic resonance images of an examination subject. The invention can particularly (but not exclusively) be used in contrast agent-intensified 3D MR angiography.

2. Description of the Prior Art

In contrast agent-intensified 3D MR angiography, MR data of an examination subject or patient are acquired while the subject or patient is injected with contrast agent. It is typically sought to acquire the MR data such that the contrast agent is acquired in its arterial phase, meaning given the passage of the contrast agent through the arteries before the return flow in the veins. A high spatial resolution is required in order to image small vessels with these MR angiography methods. In some cases it is also desirable to obtain dynamic data of the contrast agent course, so a number of successive 3D data sets are acquired with which the bolus course of the contrast agent can be detected. However, a high spatial resolution and a high temporal resolution are contradictory requirements since more data points must be acquired for a high spatial resolution than for a lower spatial resolution.

Magnetic field gradients in chronological sequence and radio-frequency pulses for excitation of the nuclear spins are used for generation of magnetic resonance images. A mathematical arrangement known as k-space or Fourier space is filled with raw data bit by bit to generate MR images. Moreover, for many small questions it is desirable to have 3D volume data sets that are well-resolved spatially. In MR imaging a 3D data set can also be generated using multi-slice techniques, but the resolution is typically ten times poorer in the third dimension (i.e., in the slice direction) than in the plane. To acquire three-dimensional volume data sets with approximately isotropic resolution, individual slices are not selectively excited with RF pulses and gradient switchings and successively measured, rather the entire three-dimensional volume is excited and the spatial resolution in the third dimension is achieved by an additional gradient, known as the phase-coding gradient. Three-dimensional image data sets are generated from these three-dimensional volume data sets or raw data sets, for example with a Fourier transformation. The extent of the introduced k-space range reflects the spatial resolution achieved in image space, while the interval of adjacent data points reciprocally correlates with the achieved image section or FOV (field of view).

Various methods for shortening the acquisition times in MR imaging are known in the prior art.

For example, in methods using a "partially parallel acquisition" a smaller set of k-space data than is required for the image calculation is acquired and the MR signal is acquired simultaneously with a number of individual acquisition coils. A complete spatial coding can be achieved with special reconstruction algorithms using spatial information introduced from the coil geometry. The methods described in the literature are for the most part divided according to whether the additional calculation steps required for this occur in k-space or in image space. In methods such as SENSE ("Sensitivity Encodings", Magn. Reson. Med. 42: 952-62) or PILS ("Partially Parallel Imaging with Localized Sensitivities", Magn. Reson. Med. 44: 602-9), for example, a determination of the sensitivity of the sensitivity profiles of the coils is implemented first and a deconvolution of the image in image space is subsequently implemented. Given methods such as Auto-SMASH ("Simultaneous Acquisition of Spatial Harmonics", Magn. Reson. Med. 425: 1066-74) or GRAPPA ("GeneRelized [sic] Autocalibrating Partially Parallel Acquisitions", Magn. Reson. Med. 47: 1202-10), missing k-space data are calculated using additional auto-calibration data. All of these methods are summarized in the following under the term PPA ("partially parallel acquisition").

A general shortening of the image acquisition time can be achieved using partial Fourier techniques given which the scanned region of k-space lies asymmetrically around the center such that outer regions are not acquired. Use is made of the fact that k-space exhibits point symmetry around the center in the ideal case. The missing regions can simply be completed by filling with zeroes ("zero filling") or using more elaborate algorithms such as, for example, POCS ("projection onto convex sets"), homodyne detection or Margosian method (see Magn. Reson. Med. 30: 51-9).

Furthermore, techniques are known that make use of the fact that the most information about the image contrast is contained in the center of k-space (see Proceedings SMRM 1992, Nr. 4236, Nr. 1138 and Nr. 1139). In these techniques (known as keyhole techniques) the entirety of k-space is first acquired, and a dynamic image series is subsequently acquired in which only the central region of k-space is acquired. The outer k-space region is not acquired in the dynamic series but rather is respectively supplemented with the data of the full exposure. Since the high frequency information and therewith the high spatial resolutions are contained in the outer k-space regions, this entails a reduced spatial resolution of the dynamic information and can lead to edge artifacts.

Furthermore, methods are known in which k-space is subdivided into different segments acquired in succession. For example, the segment A can encompass the odd k-space lines and the segment B can encompass the even k-space lines. The acquisition pattern can, for example, be ABABAB (see Frederikson et al., Proceedings SMR 1995, Nr. 197). Images are generated from a k-space data set that contains adjacent segments (such as, for example, AB and BA) such that each segment is used for the reconstruction of more than one image, allowing the temporal resolution in the reconstructed images to be improved.

A method in which the middle region of k-space is acquired with a higher temporal rate than the outer k-space regions is known from U.S. Pat. No. 5,713,358. For example, a middle k-space region A and peripheral regions B and C are differentiated, and the acquisition pattern can be ABACABAC. Images are calculated, for example, from each segment A with data of temporally adjacent segments B and C.

A further method with which the acquisition time of an MR data set can be shortened is proposed in United States Patent Application Publication No. 2003/0080737 by sampling k-space with variable sampling density. There are various methods for the image reconstruction of such data acquired in a non-Cartesian manner. A direct Fourier transformation is possible but is linked with a long computation duration. For the most part a transformation onto a Cartesian grid ("regridding") is implemented first, wherein a compensation of the variable scan density is normally important. The image reconstruction can subsequently ensue by means of a standard FT. If such an under-sampling is also associated with a limited image quality, acquisition techniques with variable density are also described as advantageous in connection with PPA methods.

A method in which a number of three-dimensional volume data sets with non-constant density are acquired is known from United States Patent Application Publication No. 2002/

01563641, wherein three-dimensional image data sets are generated on the basis of assembled volume data sets in k-space.

A method in which k-space is acquired three-dimensionally in a spiral shape is known from United States Patent Application Publication No. 2006/0062731.

Furthermore, a method is known from U.S. Pat. No. 6,487,435, which method is based on projection reconstruction acquisition methods of k-space. Here k-space is not read out with parallel readout lines, but instead each readout line proceeds through the k-space middle point. Since the k-space center is sampled with higher density than the periphery in this manner, under the circumstances an image can be calculated from fewer acquisition steps than are required for the complete measurement of corresponding Cartesian k-space. In this case a regridding with subsequent Fourier transformation would also preferably be implemented first for image calculation. Such a method with three-dimensional, radially-arranged data has the disadvantages that it can be prone to image artifacts and that a long time is typically required for the image reconstruction.

SUMMARY OF THE INVENTION

An object of the present invention is to provide a method for generation of magnetic resonance images that enables, in a stable and simple manner, the generation of MR data sets with low temporal resolution, wherein the image calculation can be optimized after the measurement with regard to various criteria such as, for example, temporal resolution, spatial resolution, artifact behavior or, respectively, effective FOV.

This object is achieved in accordance with the invention, by a method for generation of magnetic resonance images of an examination subject, wherein a number of three-dimensional volume data sets are first acquired in k-space, and in the acquisition of each three-dimensional data set a phase-coding gradient is activated along at least one spatial direction. Each three-dimensional volume data set is acquired with a non-constant density. Filtered three-dimensional volume data sets, that include a number of three-dimensional volume data sets, are generated from these acquired three-dimensional volume data sets (which are independent of one another). Three-dimensional image data sets are subsequently reconstructed on the basis of the filtered three-dimensional generated volume data sets. This method enables an extremely flexible and generally applicable MR acquisition mode with which a new degree of freedom is gained. In principle every acquired three-dimensional volume data set is a data set that provides an image data set with high temporal resolution but low spatial resolution or limited image quality. By the selection of the portions of the acquired volume data sets that should enter into the filtered volume data set, various emphases with regard to temporal resolution, spatial resolution and image quality can be selected retroactively in the reconstruction of the MR images.

The multiple three-dimensional volume data sets are advantageously selected such that they essentially or even exclusively contain non-identical points in k-space. This leads to the result that different k-space points are occupied upon generation of the filtered or assembled volume data sets, so the information in the reconstructed image data set can be increased.

According to a preferred embodiment of the invention, data of two to seven 3D volume data sets acquired in temporal succession are used to form a filtered volume data set. Given the use of three temporally successive volume data sets, the filtered volume data set contains portions from the first volume data set, the second volume data set acquired after the first volume data set and the third volume data set acquired after the second volume data set.

Naturally, any other arbitrary number of volume data sets can be arbitrarily combined. In the present invention k-space is acquired with non-constant density.

Depending on the scanning scheme of the acquired volume data sets and selection rules in the combination of the same, filtered 3D data sets can be generated that largely contain equidistant data points lying in k-space or that exhibit a varying density of the data points. In the second case, a regridding (here, however, only in two dimensions in the case of parallel readout lines) with subsequent Fourier transformation is again advantageous.

According to one embodiment of the invention the signal readouts upon acquisition of a three-dimensional data set ensues parallel along a readout gradient, meaning that the signal readout directions proceed parallel to one another. Each three-dimensional data set is thus acquired with non-constant density perpendicular to the readout gradient. This means that the density of the k-space points in the readout direction is essentially constant according to this embodiment, so this embodiment with respective parallel signal readout is not limited to constant density in the readout direction.

According to a further embodiment of the invention, individual k-space planes of the three-dimensional volume data sets are acquired in projection reconstruction methods, whereby the various planes of a three-dimensional volume data set are acquired parallel to one another. The spacing of adjacent acquired planes can decrease in the direction perpendicular to the planes from the center toward the edge of a three-dimensional volume data set. In such an acquisition form the three-dimensional data volume is acquired in a shape of a disc, the k-space points within a disc are acquired with known projection reconstruction methods. This means that the readout direction does not ensue along a fixed spatial direction. Instead of the acquisition of a plane or disc with projection reconstruction techniques, it is also possible to acquire a plane in a spiral form, with various planes being acquired in parallel with one another for a three-dimensional volume data set.

In addition to the variation of the spacing of adjacent planes in the direction perpendicular to the planes, the density within the acquired k-space planes can also decrease from the middle towards the edge of a three-dimensional volume data set. Given use of the projection reconstruction method this means that within the planes more projections are measured nearer to the k-space center than in slices at the edge of the three-dimensional volume data set. Given the use of a spiral-shaped signal readout within the planes, this means that more spiral trajectories are measured within planes that lie closer to the k-space center than in slices at the edge of the three-dimensional volume data set.

Furthermore, for acquisition of differing k-space points the same plane can be acquired with various projection reconstruction trajectories or spirals in chronological order such that significantly different k-space points are acquired in one plane.

If readout gradients parallel to one another along a fixed spatial direction are used, advantageously no identical points are acquired in k-space given the acquisition of a plurality of volume data sets.

In the use of projection reconstruction methods or spiral-shaped acquisition methods, the trajectories proceed at least through the plane center point in acquisition of a plane. Here the k-space center point of the plane is possibly acquired multiple times, even when the trajectories for the acquisitions of various three-dimensional volume data sets are acquired displaced relative to one another in the azimuthal angle. The acquisition of the same k-space points, however, is limited to the central point of the plane. The same k-space points are not acquired in different volume data sets outside of the central point of a plane. In the corresponding execution of the sampling grid in the readout direction, the repeated acquisition of the point in the center of the plane can also be avoided with projection reconstruction methods.

According to a further preferred embodiment of the invention, the portions of the individual 3D volume data sets that are assembled into a filtered data set are selected dependent on the geometry of the acquisition of k-space perpendicular to the readout direction of the individual 3D volume data sets. K-space is filled with parallel lines along the direction of the readout gradient (called Gx according to convention) in order to prevent the aforementioned disadvantages (such as artifacts) given non-parallel signal acquisition gradients. However, the density in the direction perpendicular to the readout gradient can vary either in one of the two other directions or in both other directions. This means that the density can vary along the $k_y$-direction and/or along the $k_z$-direction. Given a radially-symmetrical density change along $k_x$ or $k_y$, the portions of the individual volume data sets are advantageously likewise selected radially symmetrically for generation of a three-dimensional data set. This can mean, for example, that the k-space points of a three-dimensional data set that lie within a predetermined radial distance in the plane perpendicular to the readout gradient are used or are discarded for generation of a filtered volume data set. This radial filtering is advantageously used when the k-space density along $k_y$ and $k_z$ likewise varies in the radial direction.

By contrast, if the density distribution or frequency distribution of the measurement points is acquired along a Cartesian coordinate system, the k-space points of a three-dimensional volume data set that lie perpendicular to the readout gradient up to a predetermined k-value in the Cartesian coordinate system can be used or, respectively, discarded given generation of a filtered data set.

According to a further inventive embodiment, the data of a three-dimensional volume data set or a number of data sets can be completely adopted for the generation of a filtered three-dimensional data set. It is likewise possible that only spatially delimited k-space portions of three-dimensional volume data sets are used for the generation of a filtered three-dimensional data set. It is likewise possible to combine both of these last cited possibilities. This means that the complete data set is adopted from a first three-dimensional volume data set while, for example, only the inner or outer k-space portions of respective preceding and subsequent volume data sets are taken into account.

As mentioned above, every acquired three-dimensional volume data set is independent of the next acquired three-dimensional volume data set and each data set represents an MR image data set with low spatial resolution and possibly limited image quality. The individual three-dimensional data sets can be post-processed before forming the filtered, combined volume data set. For example, a movement correction can be effected in the event that the examination subject has moved during the image acquisition. A further post-processing possibility is the removal of venous signal portions that can result given the examination with contrast agent injection when the contrast agent has reached the veins in the examined acquisition region, which can lead to the display of the venous vessels. For example, for this purpose the three-dimensional data sets can converted into image data before the post-processing, whereby the post-processing occurs using markings to be manually set in the images or automatically using a correlation of the temporal signal curves.

According to a further embodiment, for the generation of a three-dimensional data set the density of the sampling is selected greater in the center of k-space than at the edge of the covered k-space volume. This different density distribution in k-space can, among other things, be selected since the image contrast is primarily determined by the central k-space regions while the outer k-space lines are primarily responsible for the spatial resolution. For contrast agent acquisitions it can be desirable to sample the middle k-space region with a greater density than the outer region of k-space.

According to a further preferred embodiment of the invention, the density varies in that k-space direction in which successive points of various 3D volume data sets lie in a filtered composite volume data set. For example, given varying density along the direction $k_z$ this means that k-space points of different acquired 3D volume data sets follow in this direction $k_z$.

According to a further embodiment of the invention the temporal spacing of the 3D volume data sets corresponds to the temporal spacing of the filtered 3D volume data sets, such that the reconstructed 3D image data sets have the same temporal resolution as the acquired 3D volume data sets. By interpolation of two successive 3D volume data sets it is also possible to obtain a higher temporal resolution of the reconstructed image data sets than given the acquisition of the 3D volume data sets. Naturally, it is also possible that, due to the use of a number of 3D volume data sets, the temporal spacing of the reconstructed image data sets is greater than the temporal spacing of the acquired 3D volume data sets. The temporal spacing of the reconstructed 3D image data and the spatial resolution of these 3D image data is advantageously selected dependent on the clinical question that should be answered by means of the MR exposures. Different acquisition patterns in k-space (such as, for example, patterns distributed in a rectangular, quadratic, elliptical, oval, round, triangular, hexagonal, spiral-shaped or stochastic manner) can be used for acquisition of the three-dimensional volume data set.

It is likewise possible that k-space is not completely acquired but rather is only partially acquired in the three-dimensional volume data sets, with the not-acquired k-space region being supplemented by filling with zeroes or using special algorithms such as POCS, homodyne detection or the Margosian method.

According to a further embodiment of the invention, an additional data set that essentially contains k-space data with a relatively large spacing relative to k-space can be acquired at a specific point in time, and added to all filtered three-dimensional volume data sets.

Furthermore, the density in the center of the scanned k-space volume can be greater than at the edge of the scanned k-space volume in one, multiple or all generated three-dimensional filtered data sets.

Furthermore, the measurements can be additionally accelerated with methods of partially parallel imaging by detecting the signal with an arrangement of reception coils, whereby parts of the three-dimensional volume data sets are not directly acquired but rather are calculated before and after generation of the filtered three-dimensional data sets on the basis of calibration data acquired beforehand, acquired retroactively, or integrated into the course of the measurement.

Furthermore, the acquisition of the three-dimensional volume data sets can be controlled via physiological parameters that are detected during the measurement by means of EKG, pulse trigger, ultrasound, mechanical devices and/or MR navigators.

Furthermore, the various aforementioned methods can be combined with table feed techniques in which the table on which the patient or the examination subject lies is shifted through the magnetic resonance system during the acquisition. The methods described above with the aforementioned PPA technology can likewise be combined with the use of an arrangement of a number of coils. After the acquisition of a number of three-dimensional volume data sets that occupy various k-space points in k-space, the previously acquired k-space points can be repeatedly acquired identically at a temporal interval. In the generation of a filtered three-dimensional data set, interpolation can hereby be conducted between two identical three-dimensional volume data sets that have been acquired temporally offset relative to one another.

The invention furthermore concerns a magnetic resonance system for generation of magnetic resonance images that has a signal acquisition unit for acquisition of three-dimensional volume data sets in k-space; wherein different magnetic field gradients are activated; and the signal readouts upon acquisition of a three-dimensional data set proceed parallel to one another. Each three-dimensional volume data set is acquired with a non-constant density perpendicular to the readout gradient. Furthermore, a filter or data calculation unit is provided that generates filtered 3D volume data sets that are assembled from a number of three-dimensional volume data sets, as described above. A reconstruction unit reconstructs three-dimensional image data sets on the basis of the filtered three-dimensional volume data sets.

DESCRIPTION OF THE PREFERRED EMBODIMENTS

Figure 1:
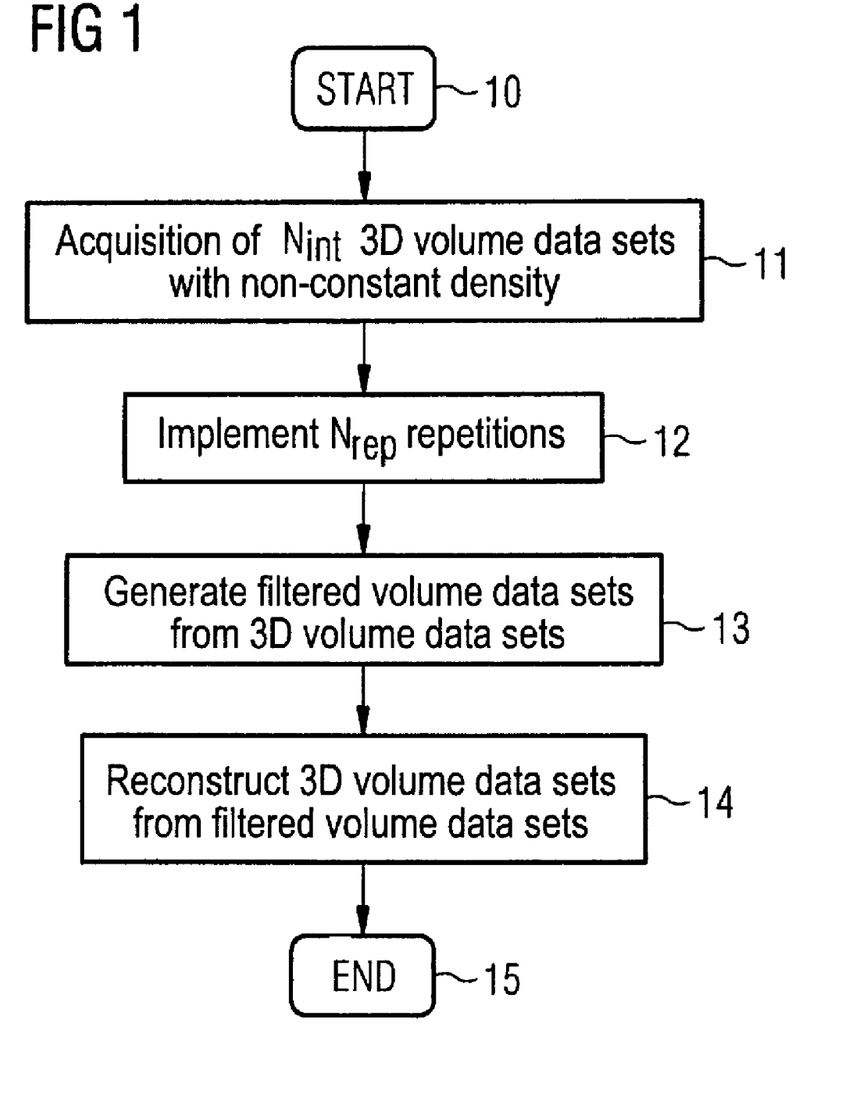
FIG. 1 is a flowchart showing the individual steps for generation of magnetic resonance images according to an embodiment of the present invention.

The basic steps that are used in the inventive method for generation of the magnetic resonance images are shown in FIG. 1. After the start of the method in step 10, a number $N_{int}$ of three-dimensional volume data sets with non-constant density is acquired in a further step 11. 3D volume data sets independent from one another and with different densities arise, the 3D volume data sets being acquired successively. These acquired volume data sets, in total $N_{int}$ volume data sets, can be acquired such that in total $N_{rep}$ repetitions are implemented (step 12), such that a total number $N_{total}$ of $N_{int} \cdot N_{rep}$ three-dimensional volume data sets are generated. Post-processings such as movement corrections or the removal of venous image signals can be subsequently implemented in a step (not shown). Finally filtered volume data sets are created (step 13) from this total number of three-dimensional volume data sets, whereby the total number of the filtered volume data sets can, for example, be $N_{reco}$. Dependent on the selection of the filtering, meaning dependent on the selection of which three-dimensional volume data sets together yield a filtered volume data set, the number of the filtered volume data sets can essentially correspond to the number of the acquired volume data sets. If the temporal interval of the volume data sets is equal to the temporal interval of the filtered data sets, $N_{reco}$ is thus equal to $N_{total}-1$, as explained later in connection with FIGS. 6-8. Three-dimensional image data sets are subsequently reconstructed on the basis of the filtered volume data sets (step 14). These image data sets can then be displayed individually before the method ends in step 15.

Figure 2:
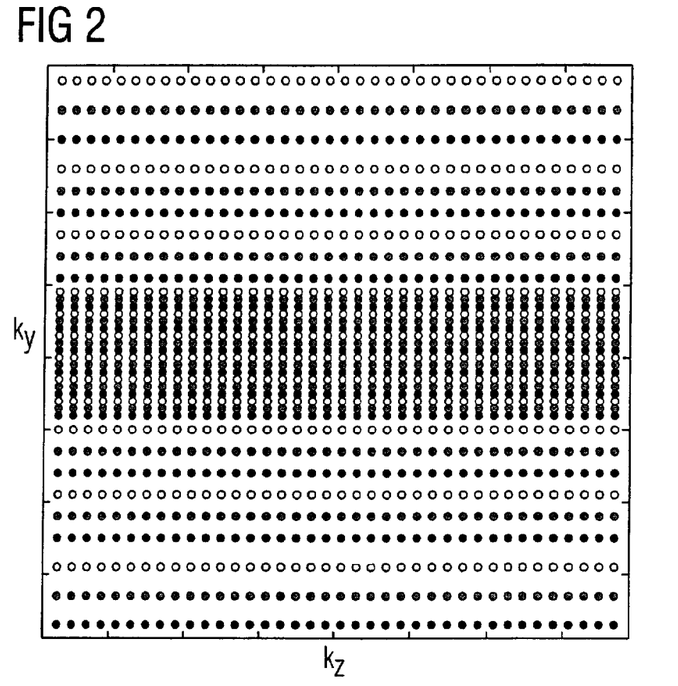
FIG. 2 shows an exemplary filtered three-dimensional volume data set with varying density in $k_y$.

A first three-dimensional filtered volume data set is exemplarily shown in FIG. 2. In the example shown in FIG. 2, k-space was read out with parallel lines in the readout direction (along $k_x$) (not shown). This means that the signal is read out during the switching of the readout gradient Gx. A three-dimensional volume is excited by an RF pulse, the spatial coding along the axes y and z ensuing by means of phase-coding gradients. In this case the phase-coding scheme or, respectively, sampling scheme can simply be visualized by depiction in the $k_y$-$k_z$ plane, with each point in the $k_y$-$k_z$ plane corresponding to a readout line. In the embodiment shown in FIG. 2 the density in k-space varies given the acquisition along the direction $k_y$, while the density remains constant along the $k_z$-direction. In the example shown in FIG. 2, three different three-dimensional data sets are generated: one data set that is represented by the black points; a second three-dimensional data set that is represented by the grey points; and a third data set that is represented by the whitest points. In the acquisition, for example, the black three-dimensional data set is acquired first, followed by the grey data set and then the white data set. To form the filtered volume data set, all three acquired volume data sets are finally completely adopted into the composite or, respectively, filtered volume data set.

Figure 3:
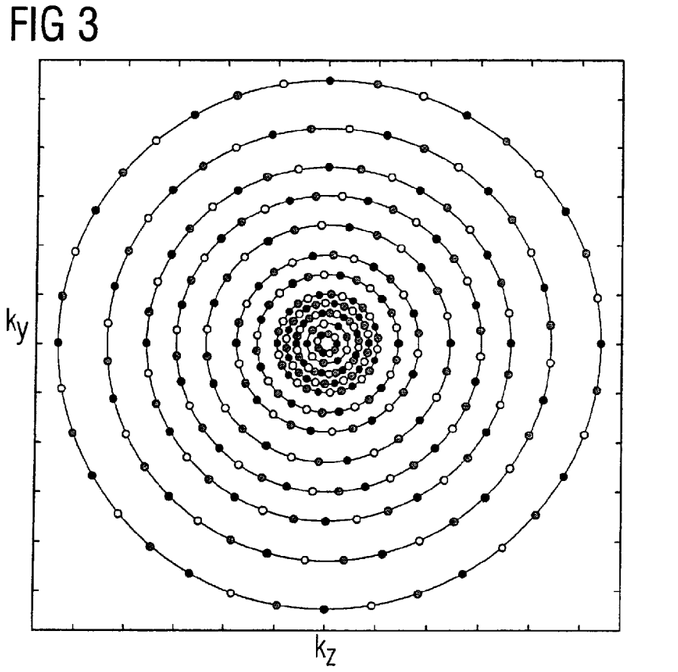
FIG. 3 shows an example of a filtered three-dimensional volume data set with radial acquisition technique, wherein the density varies in the radial direction and azimuthal direction.

A simple circular acquisition pattern with variable density is shown in FIG. 2, wherein here as well three different data sets with black, grey and white points have been acquired. Given the acquisition pattern shown in FIG. 3, the acquisition density varies both in the radial direction and in the azimuthal direction, whereby the individual raw data sets alternate only in the azimuthal direction.

Figure 4:
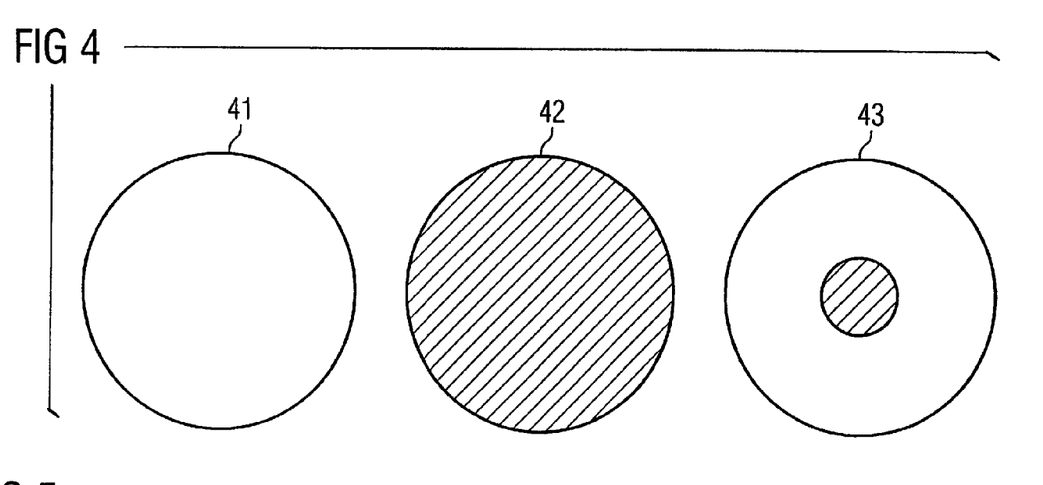
FIG. 4 shows an example of radially symmetrical filter for radially acquired k-space volume data sets.

Exemplary filter functions are shown in FIG. 4. The radial filters shown in FIG. 4 can, for example, be used in the acquisition method shown in FIG. 3. The filters shown in FIG. 4 can also be understood as masks. Given the filter or the mask 41, the entire filter, meaning that the entire volume data set to which this filter 1 is applied, is used for the filtered three-dimensional volume data set. Given the zero filter 42, the volume data set multiplied with this zero filter is not used at all. This means that a volume data set multiplied with this zero filter or, respectively, with this mask does not contribute at all to the filtered volume data set. The mask 43 shows a filter given which the data of a volume data set up to a radial distance from the center are not used while the data of the volume data set beyond this predetermined distance contribute to the filtered volume data set.

Figure 5:
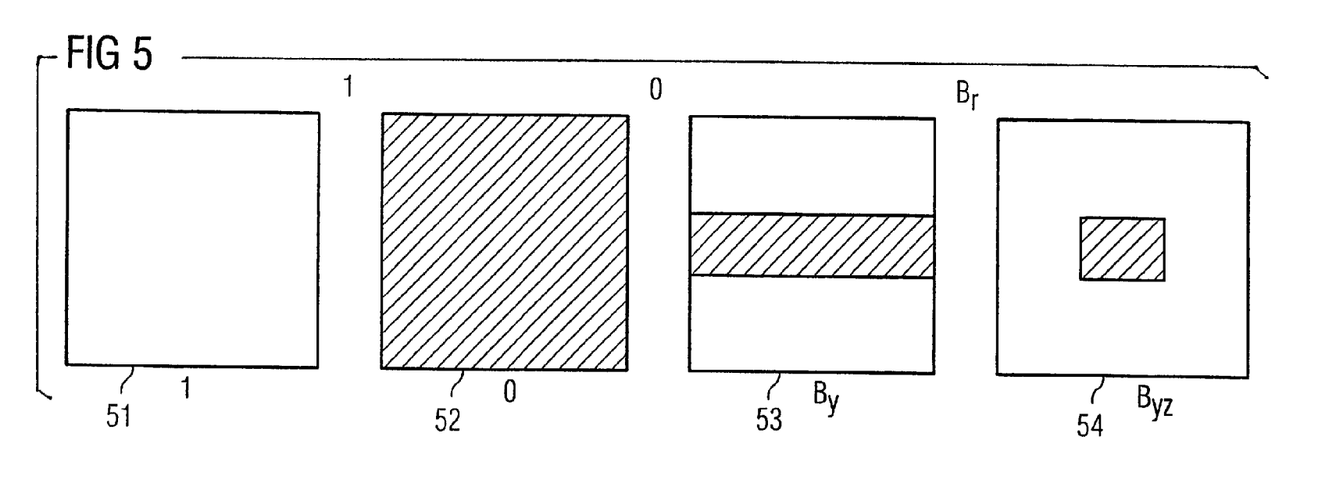
FIG. 5 shows an example of filter for quadratic or rectangular filtering.

Exemplary radially asymmetrical filters that can be used given radially asymmetrical acquisition techniques are shown in FIG. 5. The filter 51 shows that the complete data set contributes to the filtered volume data set while the quadratic filter 52 does not take into account all volume data within this square for the filtered volume data set. The filter 53 corresponds significantly to the filter 43, however in the Cartesian coordinate system, whereby k-space data that are greater than a specific k-value are taken into account while k-space data that are smaller than a predetermined k-value are not considered. The filter 54 shows a further filter given which only the volume data from the k-space middle are not considered.

Figure 6:
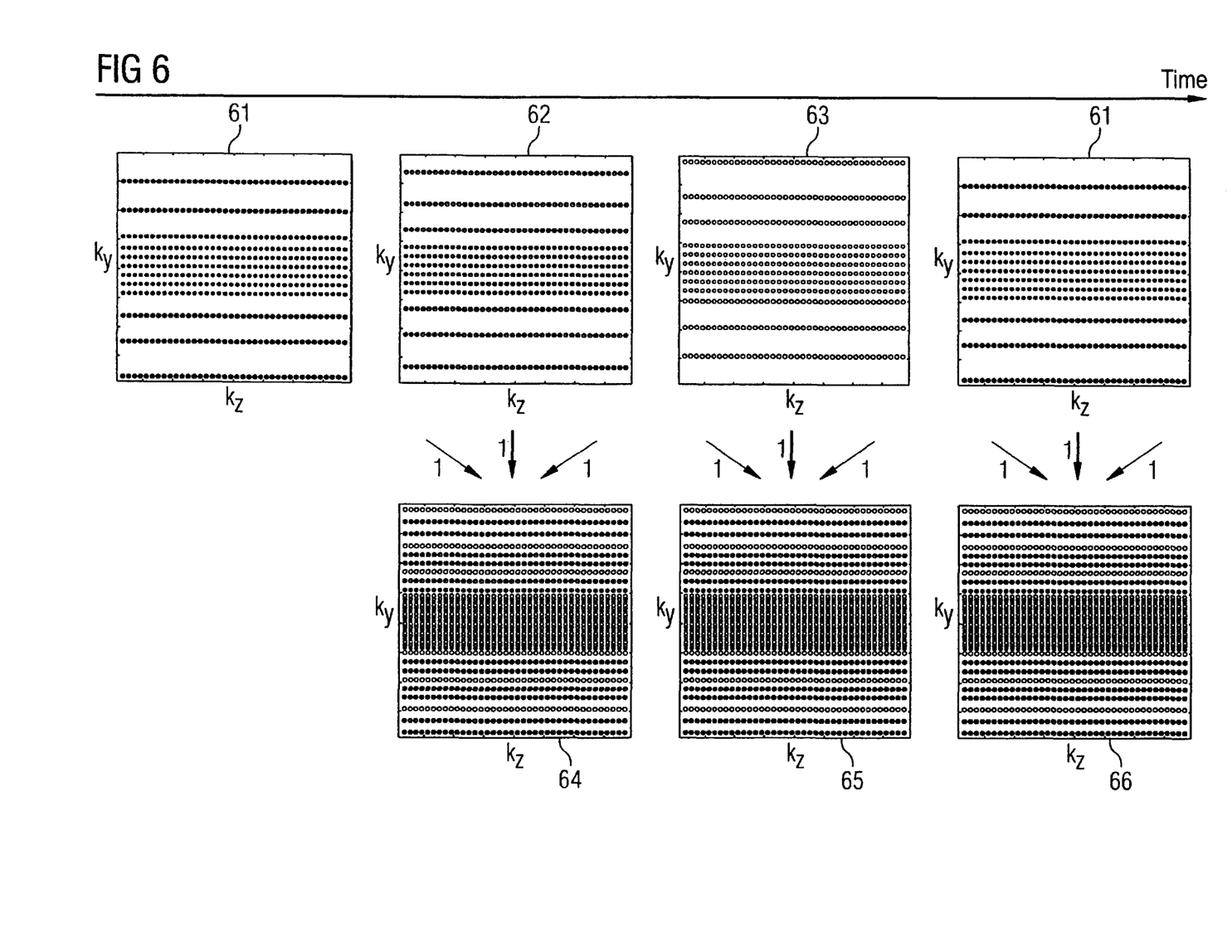
FIG. 6 illustrates an example for the generation of filtered volume data sets with their composition from the individually acquired data sets with a first filter type.

FIG. 6 shows an example of how the various individual volume data sets can be taken into account for calculation of the filtered volume data sets. FIG. 6 shows a first three-dimensional data set 61 that was first acquired along a time axis and is represented by the black points, whereby the density varies along $k_y$. The three-dimensional volume data set 62 is subsequently acquired and is represented by the grey points in the $k_y$-$k_z$ plane and shows that different k-space points were acquired in k-space than in the data set 61. A data set 63 represented by the white points is likewise acquired after the data set 62, in which data set 63 k-space points were acquired that are again different than those in the data sets 61 and 62. As in the data sets 61 and 62, the density varies along $k_y$. After the data set 63 the data set 61 follows again. Exemplary filtered volume data sets are now shown in the lower line of FIG. 6. The filtered data set 64 comprises the data sets 61, 62 and 63, whereby the entirety of the data of the data sets 61-63 is respectively used for the filtered data set. This is represented by the numeral 1, which should represent the filter. All data of the volume data sets 63, 61 and 62 are in turn considered and completely adopted in the filtered data set 66. As can be seen in FIG. 6, the filtered volume data sets have the same temporal resolution as the acquired three-dimensional volume data sets. However, the images constructed from the filtered volume data 64-66 have a better contrast than each individual data set 61, 62 or 63. If the two successive data sets 61 are considered, the temporal resolution of the filtered data sets is three times as high. The MR images are then reconstructed from these filtered k-space data.

Figure 7:
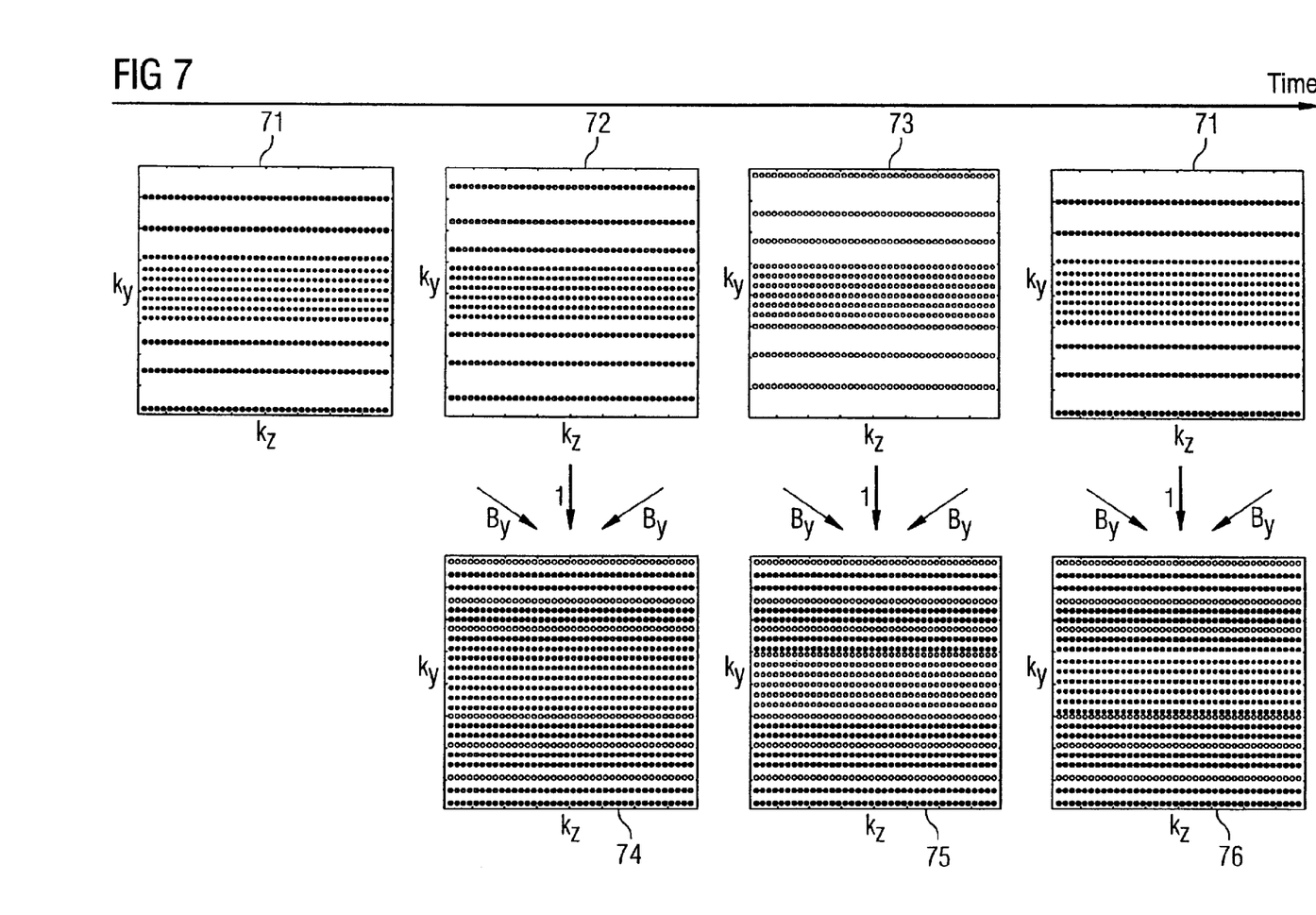
FIG. 7 shows an example of filtered volume data sets and the individual volume data sets used for this given the use of a different filter.

A further filter mechanism is shown in FIG. 7. The three-dimensional volume data sets 71, 72 and 73 with their black, grey or white points again correspond to different acquired k-space volumes. In contrast to FIG. 6, however, different filters are used. The filtered volume data set 74 results, for example, from the fact that the volume data set 72 was entirely adopted (meaning that the grey points were entirely adopted). In the volume data sets 71 and 73 the filter 53 (shown in FIG. 5) was applied, with the effect that the middle k-space lines were respectively not adopted as well. The outer k-space points with a value greater than a threshold were adopted from the volume data set 71; likewise, the k-space points that were greater than a threshold were adopted from the volume data set 73. The same applies for the composite data sets 75 and 76. In FIG. 7 the volume data set 73 was adopted entirely while only the outer k-space points from the data sets 72 and 71 were adopted, while in the filtered data set 76 the middle k-space points of the data set 71 were adopted while the outer k-space lines were adopted from the volume data set 73 and likewise the outer k-space lines were adopted from the chronologically following volume data set 72 (not shown).

In the filter shown in FIG. 7, the middle k-space region of the filtered volume data set from which the MR image is reconstructed is limited to a smaller time span while the higher spatial frequencies of adjacent data sets are taken into account. The reconstructed image thus represents a shorter time span. In contrast to the filter model shown in FIG. 6, k-space data points are not taken into account or, respectively, are removed. This can be taken into account in the data acquisition when the filtering is selected.

Figure 8:
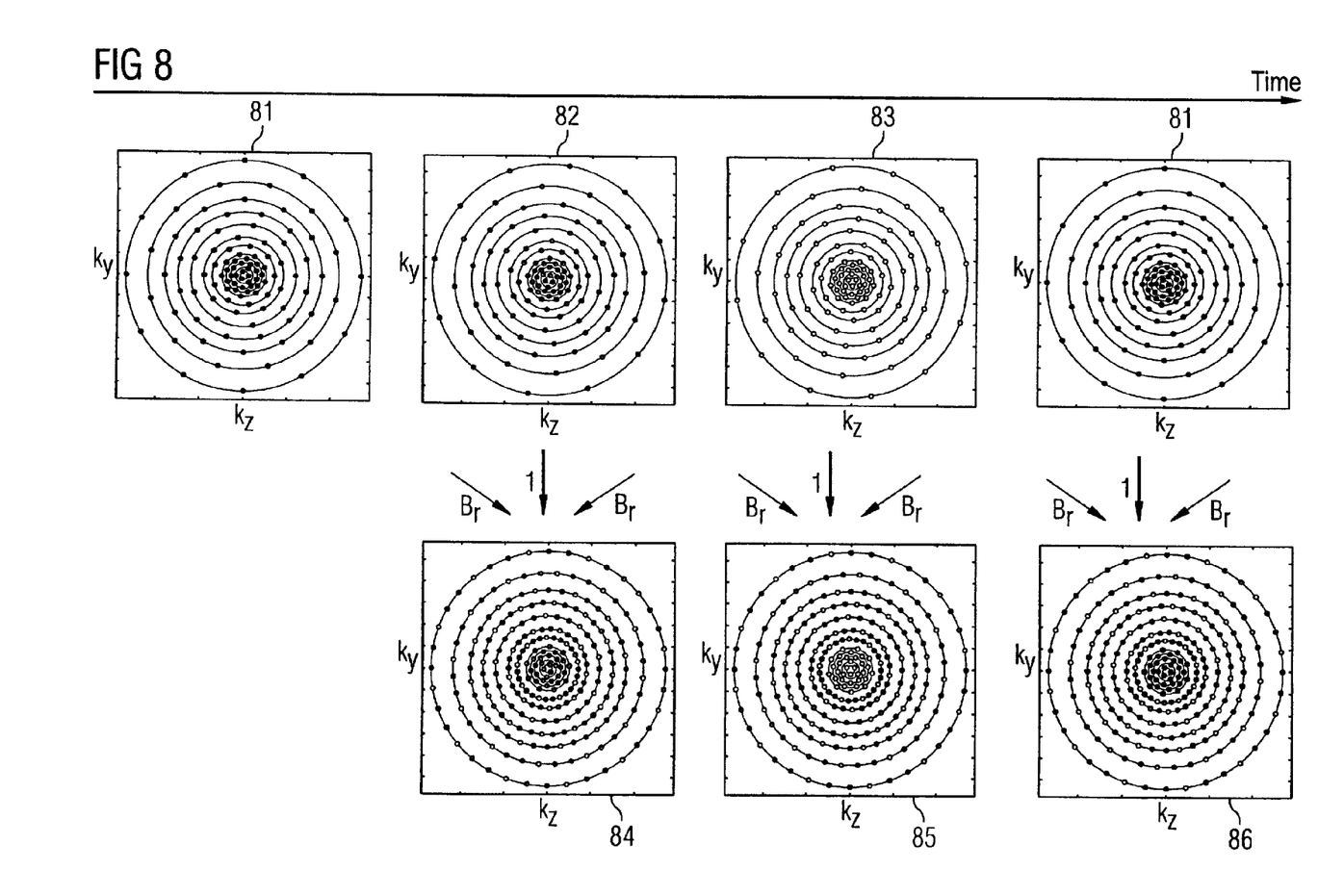
FIG. 8 shows further filtered volume data sets with radial symmetry and the three-dimensional volume data sets associated therewith, from which the filtered data sets are assembled.

A further example of composite filtered volume data sets is shown in FIG. 8. The radially symmetrical filters shown in FIG. 4 are hereby used while the acquisition technique corresponds to the acquisition technique shown in FIG. 3. The data sets 81, 82 and 83 are radially symmetrically acquired volume data sets with density change in the radial direction and in the azimuthal direction. Given formation of the composite filtered volume data sets 84-86, the filters corresponding to FIG. 7 are used, whereby the filters used were radially symmetrical. This means that the entire volume data set 82 is used in the composite volume data set 84 while only the k-space points from the adjoining data sets 81 and 83 that are further removed than a predetermined radius from the center were taken into account. The entire volume data set 83 was correspondingly taken into account in the composite filtered volume data set 85 while only the radially outlying k-points from the data sets 82 and 81 were considered.

Only simple filter types were considered in FIGS. 6-8 in order to clarify the inventive method. Naturally arbitrarily different filter types and combinations of the individual volume data sets are also possible.

Methods in which the signal readout respectively occurred in parallel in one direction were respectively shown in FIGS. 2-8.

Figure 9:
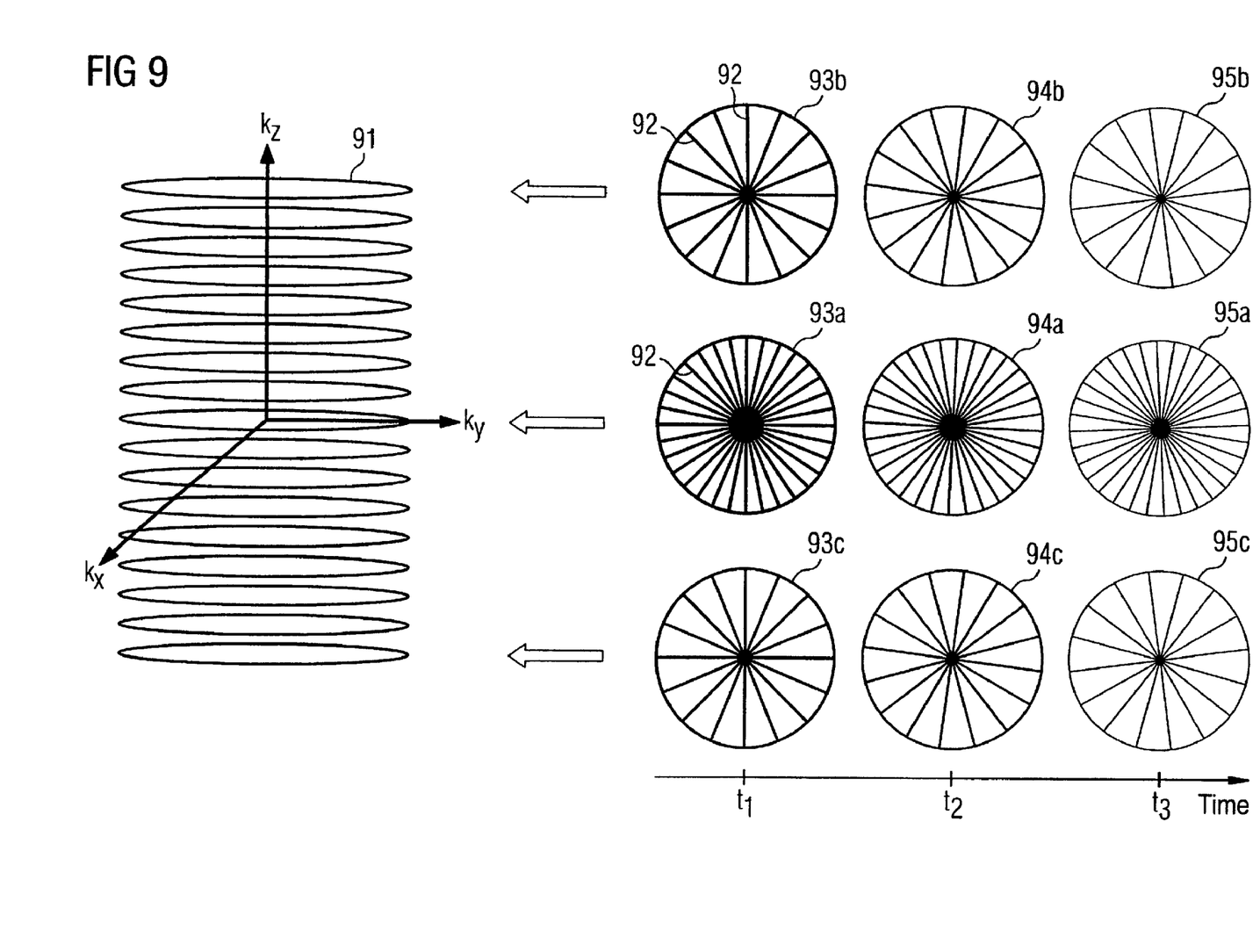
FIG. 9 is an example of the acquisition of a three-dimensional volume data set using a projection reconstruction method given the acquisition of one plane of the three-dimensional volume data set.
Figure 10:
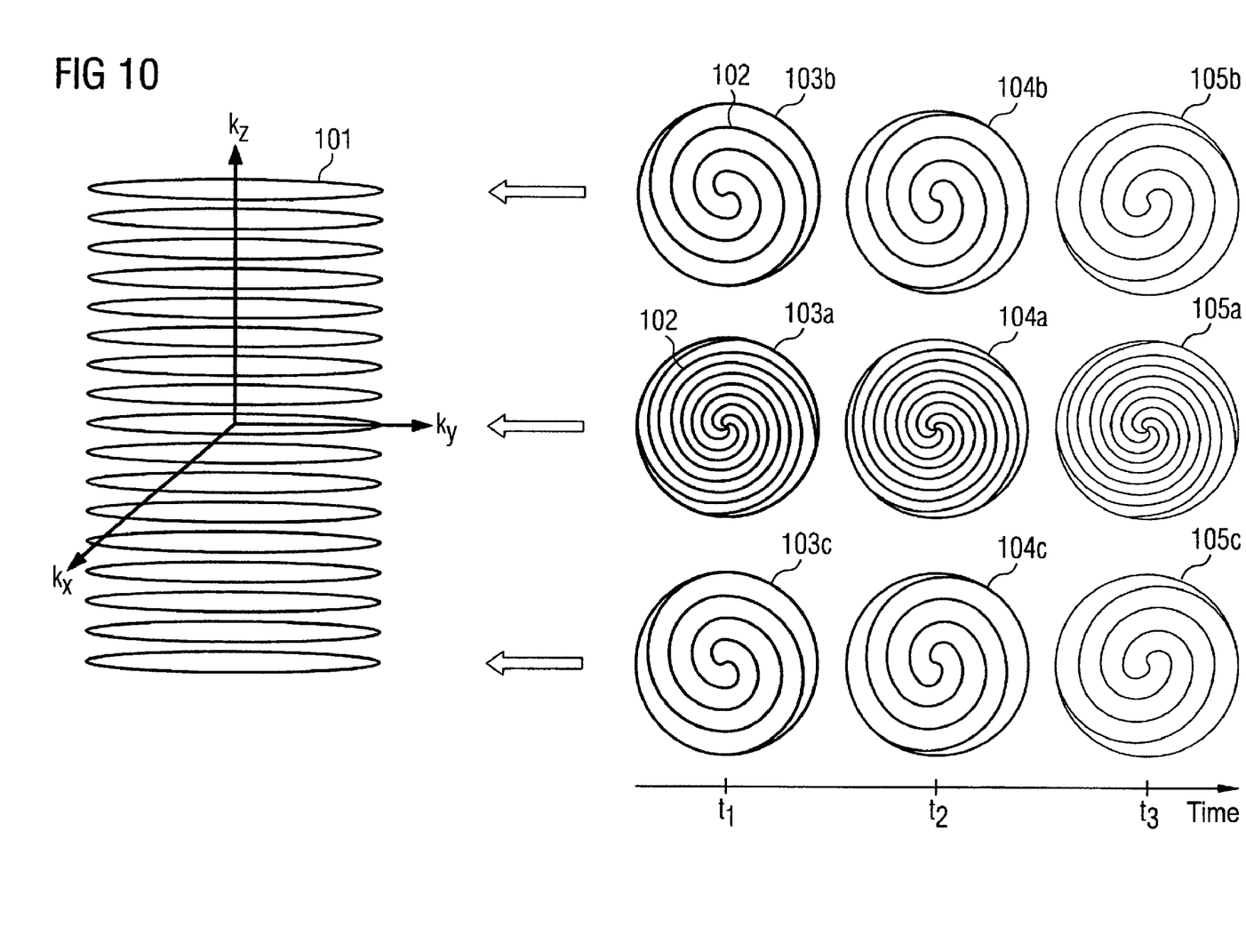
FIG. 10 shows the generation of three-dimensional volume data sets, with one k-space plane being acquired in a spiral shape.
Figure 11:
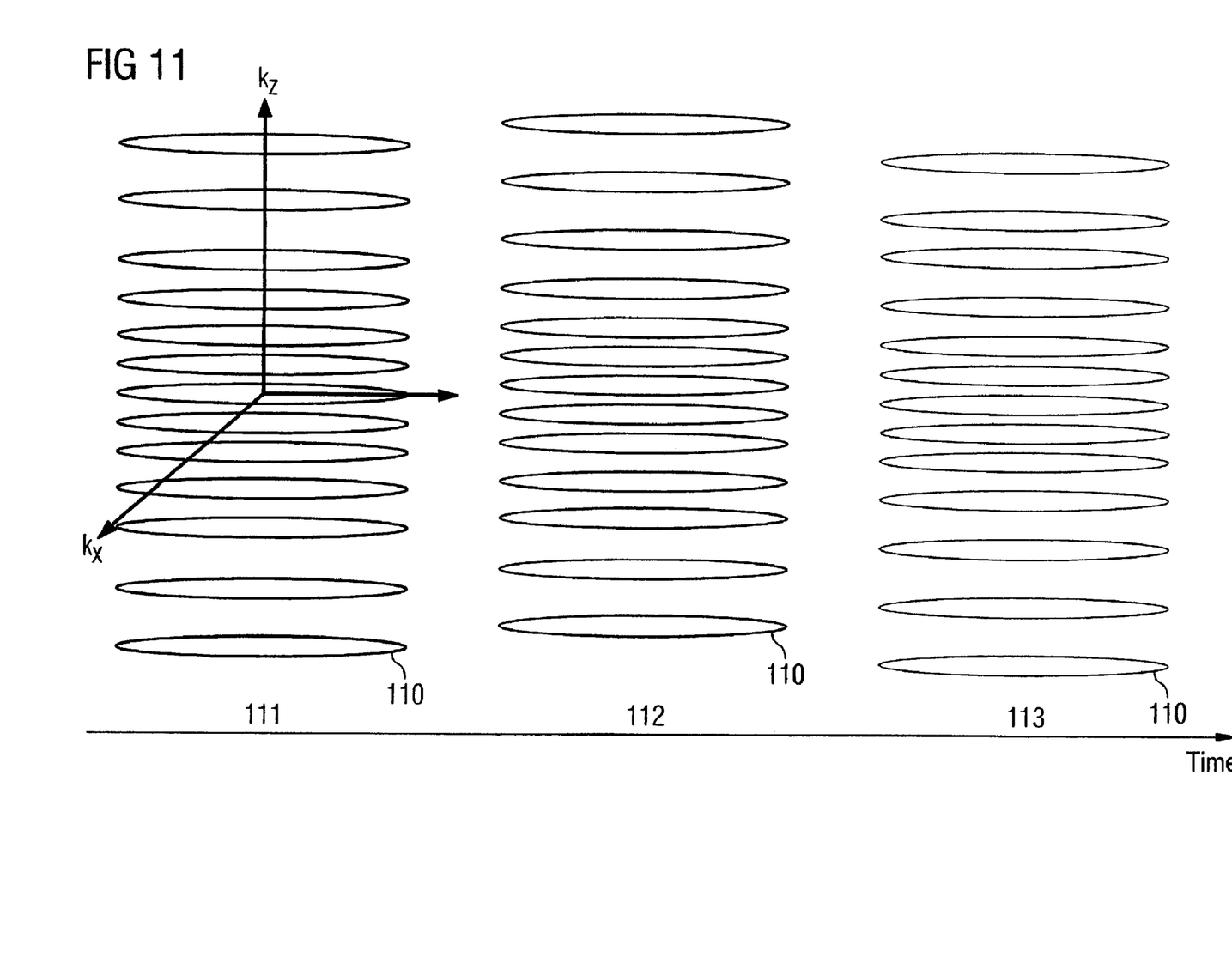
FIG. 11 shows the acquisition of three-dimensional volume data sets, wherein volume data set is in turn acquired in planes.

Further inventive embodiments are described in FIGS. 9-11. A cylindrical three-dimensional volume data set is shown as an example in FIG. 9. This volume data set can be acquired via individual planes 91 proceeding parallel to one another. In this case the signal readout does not ensue along a magnetic field gradient but rather (as shown in the right part of FIG. 9) using the known projection reconstruction method. The signal readout hereby ensues within the plane such that a straight line running through the plane center point is read out, whereby the gradients are switched such that various trajectories 92 are acquired in order to acquire one plane. The left planes respectively shown with black are respectively acquired at a time span $t_1$. As is recognizable, the density within the acquired planes varies such that the density decreases with greater $k_z$ values starting from the k-space center $k_z$=0. As is to be recognized from FIG. 9, a greater number of trajectories 92 is acquired in the plane 93a than for greater $k_z$ values. In the overview in FIG. 9 this is to be recognized in that the trajectories 92 (shown as spokes of a wheel) in the planes 93b and 93c are less dense than the spokes in the plane 93a. A further three-dimensional volume data set that is shown in FIG. 9 as a dark grey data set is acquired in a later time span $t_2$. The data set of the time span $t_2$ differs from the data set of the time span $t_1$ in that other trajectories are measured in a plane. This means that the trajectories of the plane 94a are offset relative to the trajectories of the plane 93a, such that essentially non-identical points are acquired in k-space. Since all trajectories pass through the value $k_z$=0, the trajectories of the planes 94a and 93a differ essentially in that they assume different k-space values up to the k-value in the center. During a time span $t_3$ a further volume data set is then acquired, whereby the trajectories of the plane 95a are selected such that they differ from the trajectories of the planes 94a and 93a. The same applies for the trajectories of the planes 95b and 95c in relation to the trajectories 94b and 93b as well as 94c and 93c. With such an acquisition pattern, the density varies in the radial direction, which inevitably results from the projection reconstruction method that was selected in FIG. 9. Furthermore, the density in the $k_z$ direction varies, as is shown by the different final trajectory density.

Furthermore, examples for acquisition of three-dimensional volume data sets are shown in FIG. 10. A number of planes 101 are in turn acquired parallel to one another. The method differs from methods from FIG. 9 in that, within one plane, this plane is read out in a spiral. Furthermore, the spiral spacing increases in the direction perpendicular to the plane. This means that a black volume data set is acquired during a time span $t_1$, whereby the spiral-shaped trajectories 102 have a smaller spacing in the center of k-space than at the outer edge in the direction $k_z$. This means that the plane 103a has a great spiral density than the planes at the edge of the acquired volume, which are represented by the planes 103b and 103c. The same applies for the volume data set during the time span $t_2$; the plane 104a has a greater spiral density than the planes 104b and 104c. This also applies for the planes 105a and 105b or, respectively, 105c. The spiral trajectories are in turn selected such that significantly different k-space points are acquired in the acquisition of a plane. This means that the spirals of the plane 103a lie offset relative to the spirals of the planes 104a and 105a. This also applies for the spirals of the planes 103b-105b and the spirals of the planes 103c-105c. However, according to a further embodiment the spiral-shaped trajectories 103a-105a share the same k-space points in the center of k-space, meaning that the spirals of these planes 103a-105a would be congruent while only the spirals of the outer k-space volumes would differ. A total of three-dimensional volume data sets can be used for reconstruction of image data sets according to the examples of FIGS. 9 and 10. For example, all planes from the dark grey data sets 94a-94c or 104a-104c can be used while only the outer planes of the black and light grey data sets 93a-93c or 103a-103c and 95a-95c are used for a filtered volume data set. Other filterings of the individual data sets are naturally also possible.

A further possibility for acquisition of various volume data sets is shown in FIG. 11. K-space is again filled with planes running parallel to one another. Various planes 110 are acquired in the first volume data set, whereby the plane interval increases with increasing $k_z$ value (can be seen in FIG. 11). Furthermore, a further volume data set 112 can be acquired, again with planes 110 being acquired that are offset relative to the planes 110 from the data set 111 in the $k_z$-direction. The density of the acquired planes of the volume data set 112 decreases in turn with increasing $k_z$ value. This likewise applies for the volume data set 113, given which other planes 110 are in turn acquired that were not acquired in the volume data sets 111 and 112. Various portions of the volume data sets 111, 112 and 113 can in turn be used to generate a filtered, three-dimensional volume data set. Within a plane these can be measured with the straight projection reconstruction lines from FIG. 9 or with the spiral-shaped lines from FIG. 10. The individual data sets are interleaved (interlaced) in the $k_z$-direction.

The described method enables an extremely flexible MR imaging since the temporal resolution and the spatial resolution can be influenced via the selection of the various filters and via the selection of the consideration of the individual volume data sets after the acquisition of the respective volume data sets. Each volume data set supplies an image data set with high temporal resolution but low spatial resolution. Images with higher resolution and quality can be generated via combination of arbitrarily many volume data sets. The individual three-dimensional data sets can be assembled into filtered volume data sets dependent on the desired temporal and spatial resolution.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a magnetic resonance image of an examination subject, comprising the steps of:
   with a magnetic resonance data acquisition system having a gradient coil system, acquiring a plurality of three-dimensional volume data sets in k-space from an examination subject that interacts with the magnetic resonance data acquisition system and, during the acquisition of said three-dimensional volume data sets, activating a phase-coding gradient with said gradient coil system along at least one spatial direction and acquiring each three-dimensional volume data set with a non-constant density in k-space;
   electronically filtering three-dimensional volume data sets in k-space that are assembled from a plurality of said three-dimensional volume data sets, to produce filtered three-dimensional volume data sets; and
   reconstructing three-dimensional image data sets from said filtered three-dimensional volume data sets.

2. A method as claimed in claim 1 comprising selecting said plurality of three-dimensional volume data sets, for producing said filtered three-dimensional volume data sets, as being three-dimensional volume data sets substantially comprising non-identical points in k-space.

3. A method as claimed in claim 1 comprising selecting said plurality of three-dimensional volume data sets, for producing said filtered three-dimensional volume data sets, as being three-dimensional volume data sets exclusively comprising non-identical points in k-space.

4. A method as claimed in claim 1 comprising using a number of said three-dimensional volume data sets acquired in temporal succession to produce said filtered three-dimensional volume data sets, said number being in a range between and including 2 and 7.

5. A method as claimed in claim 1 comprising transforming said filtered three-dimensional volume data sets on a Cartesian grid before reconstructing said three-dimensional image data sets to compensate for said non-constant density.

6. A method as claimed in claim 1 comprising acquiring each three-dimensional data set with signal readout directions in k-space that are parallel to each other along a readout gradient generated by said gradient coil system.

7. A method as claimed in claim 1 comprising acquiring each three-dimensional data set with said non-constant density perpendicular to a direction of a readout gradient generated by said gradient coil system.

8. A method as claimed in claim 1 comprising generating readout gradients for the respective three-dimensional volume data sets that are not identical.

9. A method as claimed in claim 1 comprising acquiring said three-dimensional volume data sets in respective k-space planes according to a projection reconstruction technique, said planes in k-space being parallel to each other.

10. A method as claimed in claim 9 comprising employing a spacing between adjacent ones of said planes that decreases in a direction perpendicular to said planes from a center toward a periphery of each three-dimensional volume data set.

11. A method as claimed in claim 10 comprising decreasing said density within each of said planes in said direction perpendicular to said planes from said center toward said periphery of each three-dimensional volume data set.

12. A method as claimed in claim 9 comprising acquiring data in identical planes in a chronological sequence with respectively different projection reconstruction trajectories, so that different k-space points are acquired in the respective planes.

13. A method as claimed in claim 1 comprising acquiring said three-dimensional volume data sets in respective k-space planes according in a spiral shape, said planes in k-space being parallel to each other.

14. A method as claimed in claim 1 comprising selecting portions of the respective three-dimensional volume data sets that are assembled into a filtered three-dimensional data set dependent on the geometry of acquisition of the respective three-dimensional volume data sets in k-space.

15. A method as claimed in claim 1 comprising using an entirety of the three-dimensional volume data set of at least one of the three-dimensional volume data sets for producing said filtered three-dimensional data set.

16. A method as claimed in claim 1 comprising using only a portion of data in respective three-dimensional volume data sets that are assembled for producing a filtered three-dimensional data set.

17. A method as claimed in claim 1 comprising post-processing said three-dimensional data sets that are used for producing said filtered three-dimensional volume data set.

18. A method as claimed in claim 17 comprising, before said post-processing, converting said three-dimensional volume data sets, that will be assembled to produce said filtered three-dimensional volume data set, into image data, and post-processing said three-dimensional data sets using markings to be manually placed in the reconstructed image.

19. A method as claimed in claim 17 comprising, before said post-processing, converting said three-dimensional volume data sets, that will be assembled to produce said filtered three-dimensional volume data set, into image data, and post-processing said three-dimensional data sets using a correlation of respective temporal signal curves of said three-dimensional volume data sets.

20. A method as claimed in claim 1 comprising varying said density with which said three-dimensional volume data sets are acquired in at least one direction perpendicular to a readout gradient generated by said gradient coil system.

21. A method as claimed in claim 1 comprising acquiring said three-dimensional volume data sets with a non-constant density that is greater at a center of k-space compared to a periphery of k-space.

22. A method as claimed in claim 1 comprising acquiring said three-dimensional volume data sets with a non-constant density that varies in at least one k-space direction in which successive points lie in the three-dimensional volume data sets assembled to produce said filtered three-dimensional volume data set.

23. A method as claimed in claim 1 comprising using only a portion of data in respective three-dimensional volume data sets that are assembled for producing a filtered three-dimensional data set, said portion comprising points in k-space within a predetermined radial distance from a plane perpendicular to a readout gradient generated by said gradient coil system.

24. A method as claimed in claim 1 comprising using only a portion of data in respective three-dimensional volume data sets that are assembled for producing a filtered three-dimensional data set, said portion comprising points in k-space outside of a predetermined radial distance from a plane perpendicular to a readout gradient generated by said gradient coil system.

25. A method as claimed in claim 1 comprising using only a portion of data in respective three-dimensional volume data sets that are assembled for producing a filtered three-dimensional data set, said portion comprising points in k-space situated perpendicular to a readout gradient generated by said gradient coil system up to a predetermined k-space value.

26. A method as claimed in claim 1 comprising using only a portion of data in respective three-dimensional volume data sets that are assembled for producing a filtered three-dimensional data set, said portion comprising points other than points in k-space situated perpendicular to a readout gradient generated by said gradient coil system up to a predetermined k-space value.

27. A method as claimed in claim 1 comprising employing a temporal interval of said three-dimensional volume data sets, that are assembled to produce said filtered three-dimensional volume data sets that is equal to a temporal interval of the filtered three-dimensional volume data sets, causing the reconstructed three-dimensional image data sets to have the same temporal interval as the acquired three-dimensional volume data sets.

28. A method as claimed in claim 1 comprising acquiring said three-dimensional volume data sets with an acquisition pattern in k-space distributed in a distribution selected from the group consisting of rectangular, quadratic, elliptical, oval, round, triangular, hexagonal, spiral-shaped, and stochastic distributions.

29. A method as claimed in claim 1 comprising acquiring each of said three-dimensional volume data sets so that k-space is only partially acquired, thereby leaving a non-acquired k-space region, and supplementing said non-acquired k-space region with a supplementing technique selected from the group consisting of zero filling, a POCS algorithm, a homodyne detection algorithm, and the Margosian method.

30. A method as claimed in claim 1 comprising acquiring said three-dimensional volume data sets with an imaging sequence selected from the group consisting of gradient echo sequences, spin echo sequences, SSFP sequences, and multi-echo sequences.

31. A method as claimed in claim 1 comprising injecting a contrast agent into the examination subject before or during acquisition of said three-dimensional volume data sets therefrom.

32. A method as claimed in claim 1 comprising, at a predetermined point in time, acquiring an additional data set from the examination subject substantially comprising k-space data spaced from a center of k-space, and adding said additional data set to each of said filtered three-dimensional volume data sets.

33. A method as claimed in claim 1 comprising producing at least one of said filtered three-dimensional filtered data sets with a density at a center of k-space that is greater than a density at a periphery of k-space.

34. A method as claimed in claim 1 comprising acquiring three-dimensional volume data sets with a plurality of radio-frequency detection coils.

35. A method as claimed in claim 34 comprising accelerating acquisition of said three-dimensional volume data sets by acquiring said three-dimensional volume data sets with a partially parallel imaging technique.

36. A method as claimed in claim 1 comprising acquiring said three-dimensional volume data sets while advancing the examination subject on a patient table through said magnetic resonance data acquisition system.

37. A method as claimed in claim 1 comprising controlling acquisition of said three-dimensional volume data sets dependent on a physiological parameter detected while acquiring said three-dimensional volume data sets.

38. A method as claimed in claim 1 comprising acquiring a plurality of identical three-dimensional volume data sets in k-space at a temporal interval after acquisition of said three-dimensional volume data sets.

39. A method as claimed in claim 38 comprising producing a filtered three-dimensional volume data set by interpolating two of said identical three-dimensional volume data sets.

40. A magnetic resonance system for generating a magnetic resonance image of an examination subject, comprising:

a magnetic resonance data acquisition system having a gradient coil system;

a control unit that operates said data acquisition system to acquire a plurality of three-dimensional volume data sets in k-space from an examination subject that interacts with the magnetic resonance data acquisition system, said control unit, during the acquisition of said three-dimensional volume data sets, activating a phase-coding gradient with said gradient coil system along at least one spatial direction and acquiring each three-dimensional volume data set with a non-constant density in k-space;

said control unit electronically filtering three-dimensional volume data sets in k-space that are assembled from a plurality of said three-dimensional volume data sets, to produce filtered three-dimensional volume data sets; and an image reconstruction unit that reconstructs three-dimensional image data sets from said filtered three-dimensional volume data sets.

* * * * *